United States Patent
Xu et al.

(10) Patent No.: US 11,424,309 B2
(45) Date of Patent: Aug. 23, 2022

(54) SUBSTRATE AND DISPLAY DEVICE HAVING A GATE DRIVER ON ARRAY CIRCUIT

(71) Applicant: WUHAN CHINA STAR OPTOELECTRONICS SEMICONDUCTOR DISPLAY TECHNOLOGY CO., LTD., Hubei (CN)

(72) Inventors: Bin Xu, Hubei (CN); Hongyu Xu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 773 days.

(21) Appl. No.: 16/301,806

(22) PCT Filed: Sep. 27, 2018

(86) PCT No.: PCT/CN2018/107807
§ 371 (c)(1),
(2) Date: Nov. 15, 2018

(87) PCT Pub. No.: WO2020/037770
PCT Pub. Date: Feb. 27, 2020

(65) Prior Publication Data
US 2021/0225980 A1 Jul. 22, 2021

(30) Foreign Application Priority Data
Aug. 20, 2018 (CN) .......................... 201810947752.7

(51) Int. Cl.
*H01L 27/12* (2006.01)
*H01L 27/32* (2006.01)
(Continued)

(52) U.S. Cl.
CPC ...... *H01L 27/3276* (2013.01); *H01L 51/0097* (2013.01); *G06F 1/1652* (2013.01);
(Continued)

(58) Field of Classification Search
CPC ............. H01L 27/3276; H01L 51/0097; H01L 2251/5338; H01L 2251/301;
(Continued)

(56) References Cited

U.S. PATENT DOCUMENTS 10,170,502 B2 * 1/2019 Jeong ................ H01L 21/31144
10,608,068 B2 * 3/2020 Liu ..................... H01L 27/3258
(Continued)

FOREIGN PATENT DOCUMENTS

| CN | 104485349 A | 4/2015 |
| CN | 107623023 A | 1/2018 |
| CN | 108242462 A | 7/2018 |

*Primary Examiner* — Ida M Soward

(57) ABSTRACT

The A substrate includes a base substrate, a wiring layer, a flexible layer, and a gate driver on array circuit, which are sequentially stacked from bottom to top. One side of the wiring layer is provided with a through hole penetrating the flexible layer to expose the gate driver on array circuit, so that the gate driver on array circuit is electrically connected to the wiring layer with the through hole.

3 Claims, 4 Drawing Sheets

(51) Int. Cl.
  *H01L 51/00* (2006.01)
  *G06F 1/16* (2006.01)
  *G09F 9/30* (2006.01)

(52) U.S. Cl.
  CPC ..... *G09F 9/301* (2013.01); *G09G 2300/0408* (2013.01); *G09G 2300/0804* (2013.01); *H01L 2251/301* (2013.01); *H01L 2251/5338* (2013.01)

(58) Field of Classification Search
  CPC ............ H01L 27/3246; H01L 27/3295; H01L 27/124; G09G 2300/0804; G09G 2300/0408; G06F 1/1652; G09F 9/301
  See application file for complete search history.

(56) References Cited

U.S. PATENT DOCUMENTS

| | | | |
|---|---|---|---|
| 11,088,175 B2 * | 8/2021 | Wen | G09G 3/3648 |
| 2016/0291380 A1 | 10/2016 | Hong et al. | |
| 2017/0155088 A1 * | 6/2017 | Kim | H01L 27/3276 |
| 2018/0053905 A1 * | 2/2018 | Lee | H01L 51/0097 |
| 2018/0090515 A1 * | 3/2018 | Sasaki | H01L 27/1218 |
| 2018/0145125 A1 * | 5/2018 | Lee | H01L 27/3276 |
| 2018/0247994 A1 * | 8/2018 | Seo | H01L 27/3276 |
| 2018/0286938 A1 * | 10/2018 | Moon | H01L 27/1248 |
| 2018/0343750 A1 * | 11/2018 | Chen | G02F 1/133305 |
| 2018/0366494 A1 * | 12/2018 | Lee | H01L 27/1218 |
| 2019/0041915 A1 * | 2/2019 | Park | H01L 51/56 |
| 2019/0096975 A1 * | 3/2019 | Park | H01L 33/56 |
| 2019/0165305 A1 * | 5/2019 | Zhang | H01L 51/5225 |
| 2019/0220644 A1 | 7/2019 | Sun et al. | |

* cited by examiner

SUBSTRATE AND DISPLAY DEVICE HAVING A GATE DRIVER ON ARRAY CIRCUIT

FIELD OF THE INVENTION

The present invention relates to a display field, and more particularly to a substrate and a display device.

BACKGROUND OF THE INVENTION

In recent years, the organic light emitting diode (OLED) possesses many excellent characteristics, such as self-illumination, low energy consumption, wide viewing angle, rich color, fast response and flexible screen preparation, and thus causes great interest in the field of scientific research and industry, and is considered to be a promising next-generation display technology. With the advent of the big screen era, many display manufacturers are conducting narrow frame designs.

In the prior art, the appearance of various technologies, such as a Gate Driver on Array (GOA) effectively reduces the frame width of the display device, thus greatly enriching the requirements of the narrow frame design. The flexible OLEDs are superior to liquid crystal displays (LCDs) in their narrow frame portions because of the flexible features. However, due to the use of GOA technology, the presence of GOA circuits and peripheral circuitry can affect the narrow frame design of the display device.

Therefore, the prior art possesses drawbacks and is in urgent need of improvement.

SUMMARY OF THE INVENTION

The embodiment of the present invention provides a substrate and a display device, which can effectively reduce a width of traces on both sides of a display area, thereby achieving a narrow frame design.

The embodiment of the present invention provides a base substrate, a wiring layer, a flexible layer and a gate driver on array circuit, which are sequentially stacked from bottom to top; wherein one side of the wiring layer is provided with a through hole penetrating the flexible layer to expose the gate driver on array circuit, so that the gate driver on array circuit is electrically connected to the wiring layer with the through hole.

In the substrate of the present invention, the wiring layer partially covers the substrate, and the flexible layer covers an upper surface and a side surface of the wiring layer.

In the substrate of the present invention, an overlap region exists between an orthographic projection of the gate driver on array circuit on the wiring layer and an orthographic projection of the flexible layer on the wiring layer, and the through hole is located in a portion of the flexible layer corresponding to the overlap region.

In the substrate of the present invention, a first opening of the through hole is connected to a lower surface of the gate driver on array circuit, and a second opening of the through hole is connected to an upper surface of the wiring layer.

In the substrate of the present invention, a position of the second opening of the through hole connected to the upper surface of the wiring layer is provided with a via penetrating the wiring layer.

In the substrate of the present invention, the through hole is filled with a source/drain metal to connect the gate driver on array circuit and the via provided in the wiring layer.

In the substrate of the present invention, the wiring layer is provided with a bonding portion and a lead wire, and the via is connected to the bonding portion through the lead wire.

In the substrate of the present invention, a buffer layer is further disposed between the flexible layer and the gate driver on array circuit, and the through hole penetrates the buffer layer.

The embodiment of the present invention further provides a display device, including the substrate of any embodiment of the present invention and a display component disposed on the substrate, wherein the display component comprises:

a gate insulating layer, an interlayer dielectric layer, a flat organic layer, an organic light emitting diode device, a first inorganic layer, an organic layer and a second inorganic layer, which are sequentially stacked from bottom to top.

In the display device of the present invention, the display component further comprises a thin film transistor, and a gate of the thin film transistor is disposed on the gate insulating layer, and a source and a drain of the thin film transistor are disposed on the interlayer dielectric layer, and the drain of the thin film transistor is connected to an anode of the organic light emitting diode device.

In the display device of the present invention, a pixel definition layer is disposed in an accommodating space formed by the organic light emitting diode device and the flat organic layer.

In the display device of the present invention, the substrate comprises:

a base substrate, a wiring layer, a flexible layer and a gate driver on array circuit, which are sequentially stacked from bottom to top; wherein one side of the wiring layer is provided with a through hole penetrating the flexible layer to expose the gate driver on array circuit, so that the gate driver on array circuit is electrically connected to the wiring layer with the through hole.

In the display device of the present invention, the wiring layer partially covers the substrate, and the flexible layer covers an upper surface and a side surface of the wiring layer.

In the display device of the present invention, an overlap region exists between an orthographic projection of the gate driver on array circuit on the wiring layer and an orthographic projection of the flexible layer on the wiring layer, and the through hole is located in a portion of the flexible layer corresponding to the overlap region.

In the display device of the present invention, a first opening of the through hole is connected to a lower surface of the gate driver on array circuit, and a second opening of the through hole is connected to an upper surface of the wiring layer.

In the display device of the present invention, a position of the second opening of the through hole connected to the upper surface of the wiring layer is provided with a via penetrating the wiring layer.

In the display device of the present invention, the through hole is filled with a source/drain metal to connect the gate driver on array circuit and the via provided in the wiring layer.

In the display device of the present invention, the wiring layer is provided with a bonding portion and a lead wire, and the via is connected to the bonding portion through the lead wire.

In the display device of the present invention, a buffer layer is further disposed between the flexible layer and the gate driver on array circuit, and the through hole penetrates the buffer layer.

The embodiment of the present invention further provides a substrate, comprising:

a base substrate, a wiring layer, a flexible layer and a gate driver on array circuit, which are sequentially stacked from bottom to top; wherein one side of the wiring layer is provided with a through hole penetrating the flexible layer to expose the gate driver on array circuit, so that the gate driver on array circuit is electrically connected to the wiring layer with the through hole, wherein the wiring layer partially covers the substrate, and the flexible layer covers an upper surface and a side surface of the wiring layer, and a buffer layer is further disposed between the flexible layer and the gate driver on array circuit, and the through hole penetrates the buffer layer.

The substrate provided by the embodiment of the present invention provides a base substrate, a wiring layer, a flexible layer and a gate driver on array circuit, which are sequentially stacked from bottom to top; wherein one side of the wiring layer is provided with a through hole penetrating the flexible layer to expose the gate driver on array circuit, so that the gate driver on array circuit is electrically connected to the wiring layer with the through hole. In the substrate provided by the embodiment of the present invention, the wiring layer is disposed in the substrate, a peripheral wiring of the gate driver on array circuit is connected to the wiring layer with the through hole in the flexible layer to reduce a frame width of a non-display area, to increase a screen occupation ratio of the display device and to improve user experience.

BRIEF DESCRIPTION OF THE DRAWINGS

In order to more clearly illustrate the embodiments of the present invention, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
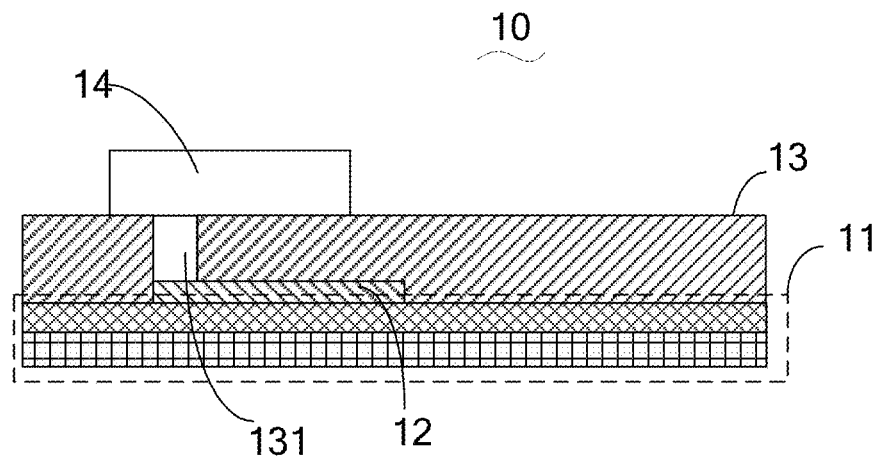
FIG. 1 is a structural diagram of a substrate according to an embodiment of the present invention.

For better explaining the technical solution and the effect of the present invention, the present invention will be further described in detail with the accompanying drawings in the specific embodiments. It is clear that the described embodiments are merely part of embodiments of the present invention, but not all embodiments. Based on the embodiments of the present invention, all other embodiments to those of ordinary skill in the premise of no creative efforts obtained, should be considered within the scope of protection of the present invention.

In the description of the present invention, it is to be understood that the terms "center", "longitudinal", "transverse", "length", "width", "thickness", "upper", "lower", "front", "Orientation of "post", "left", "right", "vertical", "horizontal", "top", "bottom", "inside", "outside", "clockwise", "counterclockwise", etc. are positional relationships based on the orientations or positional relationships shown in the drawings, and are merely for the convenience of the description of the present invention and the simplified description, and do not indicate or imply that the device or component referred to have specific orientations, and are constructed and operated in specific orientations. Therefore, these should not be construed as limiting the invention. Moreover, the terms "first" and "second" are used for descriptive purposes only and are not to be construed as indicating or implying a relative importance or implicitly indicating the number of indicated technical features. Thus, features defining "first" and "second" may include one or more of the features with either explicitly or implicitly. Besides, in the description of the present invention, "plurality" means two or more unless with being specifically indicated otherwise.

In the description of the invention, which needs explanation is that the term "installation", "connected", "connection" should be broadly understood unless those are clearly defined and limited, otherwise. For example, those can be a fixed connection, a detachable connection, or an integral connection; those can be a mechanical connection, an electrical connection or a mutual communication; those can be a direct connection, or an indirect connection with an intermediary, which may be an internal communication of two elements or an interaction of two elements. To those of ordinary skill in the art, the specific meaning of the above terminology in the present invention can be understood according to the specific circumstances.

In the present invention, the first feature "on" or "under" the second feature may include direct contact of the first and second features, and may also include that the first and second features are not in direct contact but are contacted by additional features between them. Moreover, the first feature "above", "above" and "on" the second feature includes that the first feature is directly above and obliquely above the second feature, or merely indicates that a level of the first feature is higher than that of the second feature. The first feature "below", "under" and "beneath" the second feature includes that the first feature is directly below and obliquely below the second feature, or merely indicates that a level of the first feature is lower than that of the second feature.

The following disclosure provides many different embodiments or illustrations for implementing different structures of the present invention. In order to simplify the disclosure of the present invention, the components and arrangements of the specific illustrations are described below. Certainly, they are merely illustrations and are not intended to limit the invention. In addition, the present invention may be repeated with reference to the numerals and/or reference numerals in the various embodiments, which are for the purpose of simplicity and clarity, and do not indicate the relationship between the various embodiments and/or arrangements discussed. Moreover, the present invention provides illustrations of various specific processes and materials, but one of ordinary skill in the art will recognize the use of other processes and/or the use of other materials.

The embodiment of the present invention provides a substrate, including:

a base substrate, a wiring layer, a flexible layer and a gate driver on array circuit, which are sequentially stacked from bottom to top; wherein one side of the wiring layer is provided with a through hole penetrating the flexible layer to expose the gate driver on array circuit, so that the gate driver on array circuit is electrically connected to the wiring layer with the through hole.

In some embodiments, the wiring layer partially covers the substrate, and the flexible layer covers an upper surface and a side surface of the wiring layer.

In some embodiments, an overlap region exists between an orthographic projection of the gate driver on array circuit on the wiring layer and an orthographic projection of the flexible layer on the wiring layer, and the through hole is located in a portion of the flexible layer corresponding to the overlap region.

In some embodiments, a first opening of the through hole is connected to a lower surface of the gate driver on array circuit, and a second opening of the through hole is connected to an upper surface of the wiring layer.

In some embodiments, a position of the second opening of the through hole connected to the upper surface of the wiring layer is provided with a via penetrating the wiring layer.

In some embodiments, the wiring layer is provided with a bonding portion and a lead wire, and the via is connected to the bonding portion through the lead wire.

In some embodiments, a buffer layer is further disposed between the flexible layer and the gate driver on array circuit, and the through hole penetrates the buffer layer.

The embodiment of the present invention further provides a substrate, comprising:

a base substrate, a wiring layer, a flexible layer and a gate driver on array circuit, which are sequentially stacked from bottom to top; wherein one side of the wiring layer is provided with a through hole penetrating the flexible layer to expose the gate driver on array circuit, so that the gate driver on array circuit is electrically connected to the wiring layer with the through hole, wherein the wiring layer partially covers the substrate, and the flexible layer covers an upper surface and a side surface of the wiring layer, and a buffer layer is further disposed between the flexible layer and the gate driver on array circuit, and the through hole penetrates the buffer layer.

Figure 2:
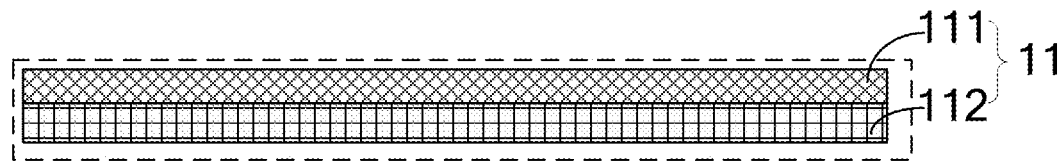
FIG. 2 is a structural diagram of a base substrate in a substrate according to an embodiment of the present invention.

Please refer to FIG. 1 and FIG. 2. FIG. 1 is a structural diagram of a substrate according to an embodiment of the present invention. FIG. 2 is a structural diagram of a base substrate.

The embodiment of the present invention provides a substrate 10, including:

a base substrate 11, a wiring layer 12, a flexible layer 13 and a gate driver on array circuit 14, which are sequentially stacked from bottom to top; wherein one side of the wiring layer 12 is provided with a through hole 131 penetrating the flexible layer 13 to expose the gate driver on array circuit 14, so that the gate driver on array circuit 14 is electrically connected to the wiring layer 12 with the through hole 131.

Specifically, the substrate 11 may be formed by stacking an inorganic layer 111 and a first flexible layer 112, or may be formed by stacking other material layers, which is not limited herein. The wiring layer 12 may be a circuit board or a conductive metal plate or some other printed circuit board for wiring, and a trace of the gate driver on array circuit 14 is connected with the wiring layer 12 with the through hole 131. The position of the through hole 131 may be at left side or right side of the flexible layer 13 or at both sides, which will not be described herein.

For instance, the first flexible layer 112 may be made of a polymer material such as polyimide (PI).

Figure 3:
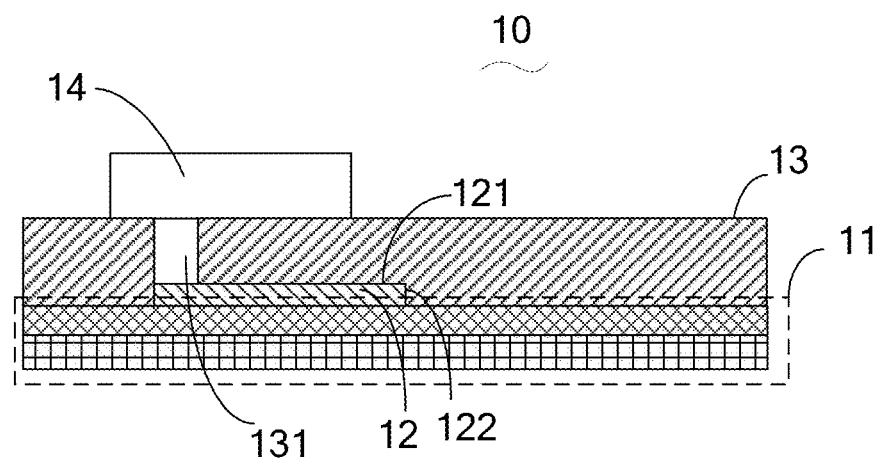
FIG. 3 is another structural diagram of a substrate according to an embodiment of the present invention.

In some embodiments, referring to FIG. 3, FIG. 3 is another structural diagram of a substrate according to the first preferred embodiment of the present invention.

The wiring layer 12 partially covers the substrate 11, and the flexible layer 13 covers an upper surface 121 and a side surface 122 of the wiring layer 12.

Since the wiring layer 12 is an external wiring board, the size does not need to be the same as the sizes of other material layers. Therefore, in order not to affect the internal structure of the substrate 10, a smaller shape structure may be provided as possible, so that the wiring layer 12 partially covers the substrate 11. Certainly, the wiring layer may also cover the entire substrate 11 according to the situation, which is not limited herein. The flexible layer 13 is stacked on the substrate 11, and thus, the flexible layer 13 covers the upper surface 121 of the wiring layer 12 and the side surfaces 122 at both sides.

Figure 4:
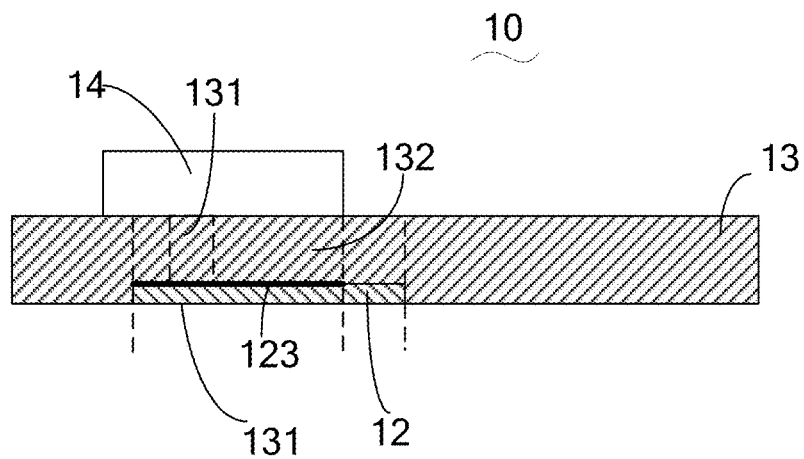
FIG. 4 is another structural diagram of a substrate according to an embodiment of the present invention.

In some embodiments, referring to FIG. 4, FIG. 4 is another structural diagram of a substrate according to an embodiment of the present invention.

An overlap region 123 exists between an orthographic projection of the gate driver on array circuit 14 on the wiring layer 12 and an orthographic projection of the flexible layer 13 on the wiring layer 12, and the through hole 131 is located in a portion of the flexible layer 132 corresponding to the overlap region 123.

The through hole 131 is disposed between the gate driver on array circuit 14 and the wiring layer 12 for connecting the gate driver on array circuit 14 and the wiring layer 12. Therefore, through hole is disposed in the overlap region 123 existing between the orthographic projection of the gate driver on array circuit 14 on the wiring layer 12 and the orthographic projection of the flexible layer 13 on the wiring layer 12, which can ensure that the wiring layer 12 is connected, and the gate driver on array circuit 14 is also connected.

Figure 5:
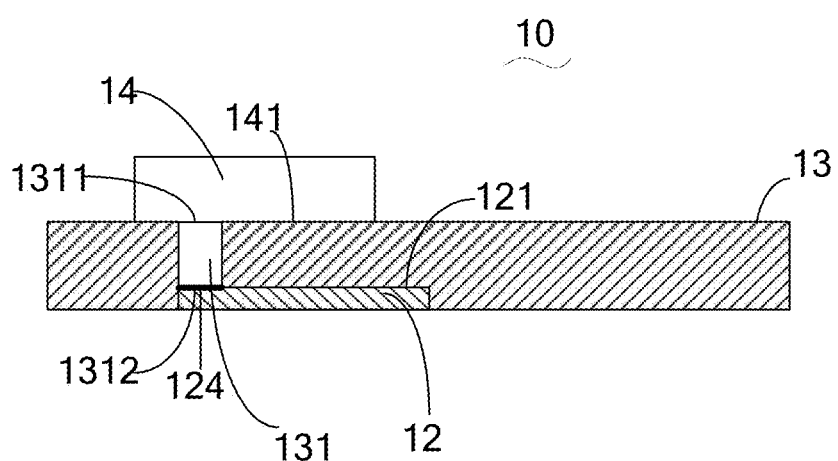
FIG. 5 is another structural diagram of a substrate according to an embodiment of the present invention.

In some embodiments, referring to FIG. 5, FIG. 5 is another structural diagram of a substrate according to an embodiment of the present invention.

A first opening 1311 of the through hole 131 is connected to a lower surface 141 of the gate driver on array circuit 14, and a second opening 1312 of the through hole 131 is connected to an upper surface 121 of the wiring layer 12.

A position of the second opening 1312 of the through hole 131 connected to the upper surface 121 of the wiring layer 12 is provided with a via 124 penetrating the wiring layer.

The through hole 131 is filled with a source/drain metal to connect the gate driver on array circuit 14 and the via 124 provided in the wiring layer 12.

The metal material filled in the through hole 131 is limited to the source/drain metal, and may be other metal materials that can conduct electricity, which is not limited herein.

Figure 6:
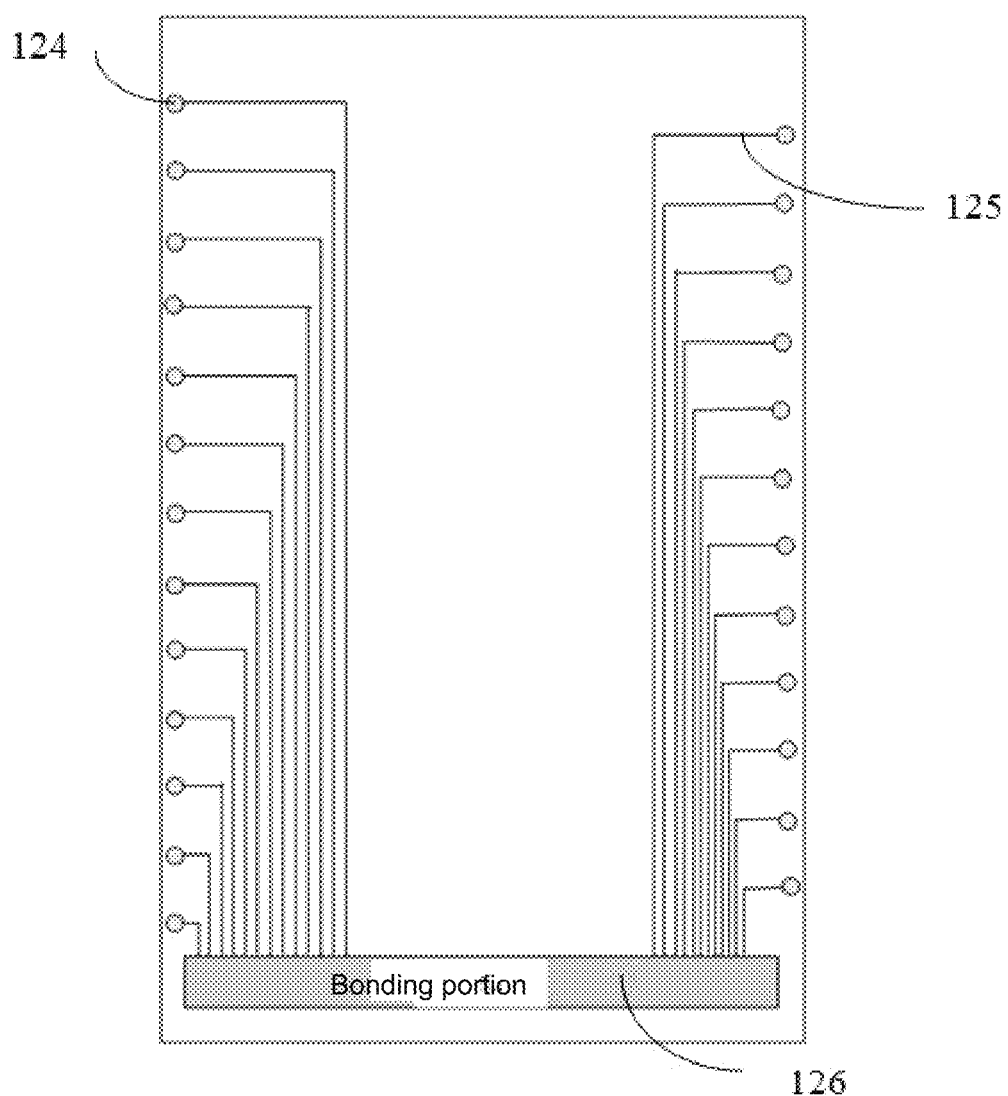
FIG. 6 is a top view diagram of a wiring layer in a substrate according to an embodiment of the present invention.

Please refer to FIG. 6. FIG. 6 is a top view diagram of a wiring layer in a substrate according to an embodiment of the present invention.

The wiring layer 12 is provided with a bonding portion 126 and a lead wire 125, and the via 124 is connected to the bonding portion 126 through the lead wire 125. Specifically, the lead wires 125 on the wiring layer 12 are not limited to the wiring mode shown in FIG. 6, and other wiring methods may be adopted, and no specification is made.

Figure 7:
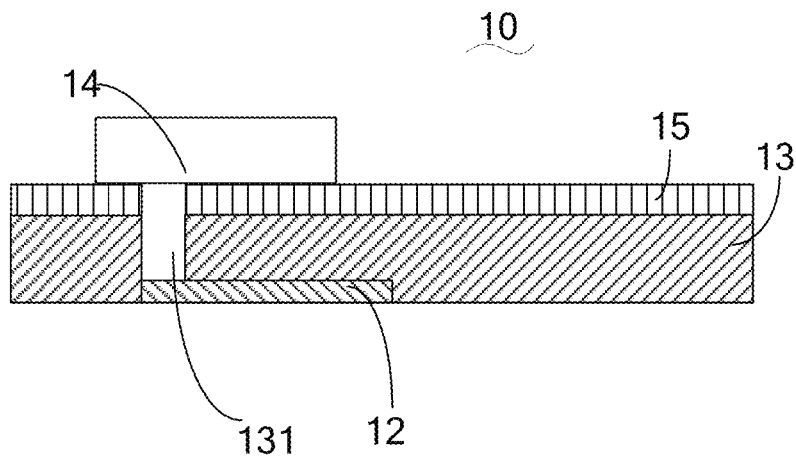
FIG. 7 is another structural diagram of a substrate according to an embodiment of the present invention.

In some embodiments, as shown in FIG. 7, FIG. 7 is another structural diagram of a substrate according to an embodiment of the present invention.

A buffer layer 15 may be further disposed between the flexible layer 13 and the gate driver on array circuit 14, and the through hole 131 penetrates the buffer layer 15. The buffer layer 15 can serve to protect the substrate 10, and any material layer that serves as a buffer can be disposed between the flexible layer 13 and the gate driver on array circuit 14, and is not limited thereto.

The substrate 10 provided by the embodiment of the present invention includes a base substrate 11, a wiring layer 12, a flexible layer 13 and a gate driver on array circuit 14, which are sequentially stacked from bottom to top; wherein one side of the wiring layer 12 is provided with a through hole 131 penetrating the flexible layer 13 to expose the gate driver on array circuit 14, so that the gate driver on array circuit 14 is electrically connected to the wiring layer 12 with the through hole 131. In the substrate 10 provided by the embodiment of the present invention, the wiring layer 12 is disposed in the substrate 10, a peripheral wiring of the gate driver on array circuit 14 is connected to the wiring layer 12 with the through hole 131 in the flexible layer 13 to reduce a frame width of a non-display area, to increase a screen occupation ratio of the display device and to improve user experience.

The embodiment of the present invention further provides a display device, including a substrate and a display component disposed on the substrate, wherein the display component includes:

a gate insulating layer, an interlayer dielectric layer, a flat organic layer, an organic light emitting diode device, a first inorganic layer, an organic layer and a second inorganic layer, which are sequentially stacked from bottom to top.

In some embodiment, the display component further comprises a thin film transistor, and a gate of the thin film transistor is disposed on the gate insulating layer, and a source and a drain of the thin film transistor are disposed on the interlayer dielectric layer, and the drain of the thin film transistor is connected to an anode of the organic light emitting diode device.

In some embodiment, a pixel definition layer is disposed in an accommodating space formed by the organic light emitting diode device and the flat organic layer.

In some embodiments, the substrate includes:

a base substrate, a wiring layer, a flexible layer and a gate driver on array circuit, which are sequentially stacked from bottom to top; wherein one side of the wiring layer is provided with a through hole penetrating the flexible layer to expose the gate driver on array circuit, so that the gate driver on array circuit is electrically connected to the wiring layer with the through hole.

In some embodiments, the wiring layer partially covers the substrate, and the flexible layer covers an upper surface and a side surface of the wiring layer.

In some embodiments, an overlap region exists between an orthographic projection of the gate driver on array circuit on the wiring layer and an orthographic projection of the flexible layer on the wiring layer, and the through hole is located in a portion of the flexible layer corresponding to the overlap region.

In some embodiments, a first opening of the through hole is connected to a lower surface of the gate driver on array circuit, and a second opening of the through hole is connected to an upper surface of the wiring layer.

In some embodiments, a position of the second opening of the through hole connected to the upper surface of the wiring layer is provided with a via penetrating the wiring layer.

In some embodiments, the through hole is filled with a source/drain metal to connect the gate driver on array circuit and the via provided in the wiring layer.

In some embodiments, the wiring layer is provided with a bonding portion and a lead wire, and the via is connected to the bonding portion through the lead wire.

In some embodiments, a buffer layer is further disposed between the flexible layer and the gate driver on array circuit, and the through hole penetrates the buffer layer.

Figure 8:
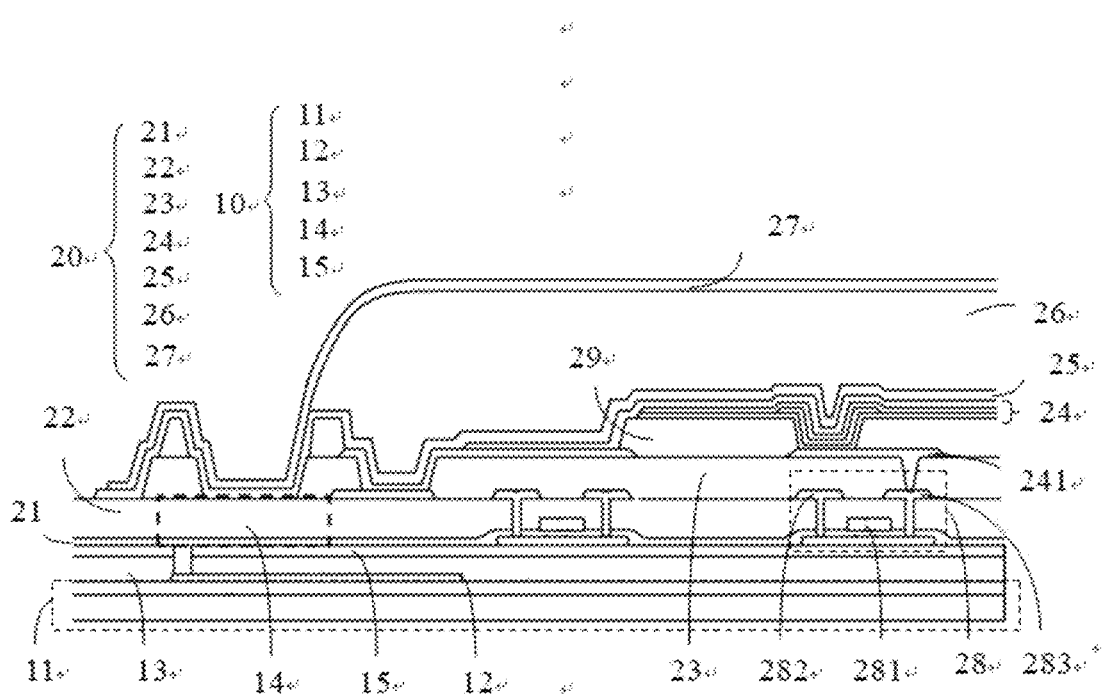
FIG. 8 is a structural diagram of a display device according to an embodiment of the present invention.

In some embodiments, as shown in FIG. 8, FIG. 8 shows a display device according to an embodiment of the present invention, which includes a substrate 10 and display component 20 disposed on the substrate 10, including:

a gate insulating layer 21, an interlayer dielectric layer 22, a flat organic layer 23, an organic light emitting diode device 24, a first inorganic layer 25, an organic layer 26 and a second inorganic layer 27, which are sequentially stacked from bottom to top.

The display component further includes a thin film transistor 28, and a gate 281 of the thin film transistor is disposed on the gate insulating layer 21, and a source 282 and a drain 283 of the thin film transistor are disposed on the interlayer dielectric layer 22, and the drain 283 of the thin film transistor is connected to an anode 241 of the organic light emitting diode device 24.

A pixel definition layer 29 is disposed in an accommodating space formed by the organic light emitting diode device 24 and the flat organic layer 23.

Specifically, the organic light emitting diode device includes an anode, a hole transport layer, a light emitting layer, an electron transport layer and a cathode (neither shown in the drawing). When the power supply reaches an appropriate voltage, the anode holes and the cathode electrons are combined in the light emitting layer to generate light, thereby producing red, green and blue (RGB) three primary colors.

In order to further describe the present invention, the following description is conducted for a manufacturing method of the substrate.

The embodiment of the present invention further provides a manufacturing method of a substrate, including:

providing a base substrate, and preparing a wiring layer on the base substrate;

preparing a flexible layer on wiring layer to cover the wiring layer and the base substrate;

disposing a gate driver on array on the flexible layer, wherein an overlap region exists between an orthographic projection of the gate driver on array circuit on the wiring layer and an orthographic projection of the flexible layer on the wiring layer, and a through hole penetrating the flexible layer is located in the overlap region.

The manufacturing method of the substrate provided by the embodiment of the present invention is applied in the display device. The wiring layer is disposed in the substrate, and the through hole is disposed in the flexible layer on the wiring layer to connect the wiring layer and the gate driver on array circuit, and the peripheral wiring of the gate driver on array circuit is connected to the wiring layer with the through hole to reduce a frame width of a non-display area, to increase a screen occupation ratio of the display device and to improve user experience.

In the foregoing embodiments, the description of the various embodiments have respective different emphases, and a part in some embodiment, which is not described in detail can be referred to the related description of other embodiments.

The substrate, the display device and the manufacturing method of the substrate provided by the embodiments of the present invention are described in detail as aforementioned, and the principles and implementations of the present invention have been described with reference to specific illustrations. The description of the foregoing embodiments is merely for helping to understand the technical solutions of the present invention and the core ideas thereof; those skilled in the art should understand that the technical solutions described in the foregoing embodiments may be modified, or some of the technical features may be equivalently replaced; and the modifications or replacements do not deviate from the spirit and scope of the technical solutions of the embodiments of the present invention.

What is claimed is:

1. A substrate, comprising:
a base substrate, a wiring layer, a flexible layer and a gate driver on array circuit, which are sequentially stacked from bottom to top; wherein one side of the wiring layer is provided with a through hole penetrating the flexible layer to expose the gate driver on array circuit, so that the gate driver on array circuit is electrically connected to the wiring layer with the through hole, wherein a buffer layer is further disposed between the flexible layer and the gate driver on array circuit, and the through hole penetrates the buffer layer, wherein the wiring layer partially covers the base substrate, and the flexible layer covers an upper surface and a side surface of the wiring layer, wherein an overlap region exists between an orthographic projection of the gate driver on array circuit on the wiring layer and an orthographic projection of the flexible layer on the wiring layer, and the through hole is located in a portion of the flexible layer corresponding to the overlap region, wherein a first opening of the through hole is connected to a lower surface of the gate driver on array circuit, and a second opening of the through hole is connected to an upper surface of the wiring layer, wherein a position of the second opening of the through hole connected to the upper surface of the wiring layer is provided with a via penetrating the wiring layer.

2. The substrate according to claim 1, wherein the through hole is filled with a source/drain metal to connect the gate driver on array circuit and the via provided in the wiring layer.

3. The substrate according to claim 2, wherein the wiring layer is provided with a bonding portion and a lead wire, and the via is connected to the bonding portion through the lead wire.

* * * * *